US008962137B2

United States Patent
Lee et al.

(10) Patent No.: US 8,962,137 B2
(45) Date of Patent: Feb. 24, 2015

(54) BRANCHED NANOWIRE AND METHOD FOR FABRICATION OF THE SAME

(75) Inventors: Eun Kyung Lee, Suwon-si (KR); Byoung Ryong Choi, Seoul (KR); Sang Jin Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 1626 days.

(21) Appl. No.: 12/401,891

(22) Filed: Mar. 11, 2009

(65) Prior Publication Data

US 2010/0084628 A1    Apr. 8, 2010

(30) Foreign Application Priority Data

Oct. 7, 2008    (KR) .................. 10-2008-0098174

(51) Int. Cl.
| | | |
|---|---|---|
| *H01L 29/06* | (2006.01) | |
| *H01L 21/02* | (2006.01) | |
| *C30B 11/12* | (2006.01) | |
| *C30B 25/00* | (2006.01) | |

(Continued)

(52) U.S. Cl.
CPC .......... *H01L 21/02521* (2013.01); *C30B 11/12* (2013.01); *C30B 25/005* (2013.01); *C30B 25/20* (2013.01); *C30B 29/06* (2013.01); *C30B 29/605* (2013.01); *H01L 21/02532* (2013.01); *H01L 21/02565* (2013.01); *H01L 21/02603* (2013.01); *H01L 21/02639* (2013.01); *H01L 21/02645* (2013.01); *H01L 21/02653* (2013.01); *H01L 21/02381* (2013.01); *H01L 21/02488* (2013.01); *H01L 21/02573* (2013.01); *Y10S 977/762* (2013.01); *Y10S 977/773* (2013.01)
USPC ........... 428/369; 428/364; 428/372; 977/762; 977/773; 438/758; 257/9

(58) Field of Classification Search
CPC ........ B82Y 10/00; B82Y 40/00; B82Y 30/00; H01L 21/02603; H01L 29/0669; H01L 21/02532; H01L 21/02381; Y10S 977/762; C30B 25/005; C30B 11/00; C30B 29/16; C30B 29/06
USPC .................. 977/762, 773; 428/364, 369, 372; 257/9; 438/758
See application file for complete search history.

(56) References Cited

U.S. PATENT DOCUMENTS

| | | | |
|---|---|---|---|
| 7,179,561 B2 | 2/2007 | Niu et al. | |
| 2006/0225162 A1* | 10/2006 | Yi ................................. | 977/754 |
| 2011/0042641 A1* | 2/2011 | Lieber et al. ...................... | 257/9 |

FOREIGN PATENT DOCUMENTS

KR    1020070048943 A    5/2007

OTHER PUBLICATIONS

"Rational Growth of Branched and Hyperbranched Nanowire Structures"; Author: Wang, et al.; Nano Letters, vol. 4, No. 5, pp. 871-874 (2004).

(Continued)

*Primary Examiner* — Matthew Matzek
(74) *Attorney, Agent, or Firm* — Cantor Colburn LLP

(57) ABSTRACT

Disclosed herein are a branched nanowire having parasitic nanowires grown at a surface of the branched nanowire, and a method for fabricating the same. The branched nanowire may be fabricated in a fractal form and seeds of the parasitic nanowires may be formed by thermal energy irradiation and/or a wet-etching process. The branched nanowire may effectively be used in a wide variety of applications such as, for example, sensors, photodetectors, light emitting elements, light receiving elements, and the like.

9 Claims, 6 Drawing Sheets

(51) Int. Cl.
*C30B 25/20* (2006.01)
*C30B 29/06* (2006.01)
*C30B 29/60* (2006.01)

(56) References Cited

OTHER PUBLICATIONS

Pan et al; "Liquid gallium ball/crystalline silicon polyhedrons/aligned silicon oxide nanowires sandwich structure: An interesting nanowire growth route" Applied Physics Letters, vol. 83, No. 15, 2003, pp. 3159-3161.

Yu et al; "One-dimensional silicon nanostructures fabricated by thermal evaporation" Materials Science and Engineering C, vol. 26, 2006, pp. 800-804.

Extended European Search Report for application No. 09160892.7-1215/2175053 dated Nov. 2, 2010.

* cited by examiner

BRANCHED NANOWIRE AND METHOD FOR FABRICATION OF THE SAME

CROSS-REFERENCE TO RELATED APPLICATIONS

This application claims priority to Korean Patent Application No. 2008-98174, filed on Oct. 7, 2008, and all the benefits accruing therefrom under 35 U.S.C. §119, the contents of which in its entirety are herein incorporated by reference.

BACKGROUND

1. Field

This disclosure relates to a branched nanowire, a method for fabrication thereof, and a nano device using the same and, more particularly, to a branched nanowire with a fractal structure having a broad surface area capable of being used in various applications including, for example, an optoelectronic device, a sensor, an energy storage device and so forth. This disclosure also relates to a method for fabrication of various devices that employ the branched nanowire.

2. Description of the Related Art

It is generally known that a nanowire is a linear material having a diameter that is on the order of nanometers and a length that ranges from several hundred nanometers to millimeters. The nanowire has varied physical properties that are dependent on its diameter and/or its length.

Such nanowires exhibits quantum limiting effects owing to their small sizes. Due to its small size (e.g., diameter and/or length), the nanowire has electrical and/or optical characteristics that are different from other bulk materials. Nanowires have therefore drawn considerable attention because of their usefulness in applications that use advanced technology such as in electronic devices, optical devices, and the like. Silicon nanowires are especially capable of being used in silicon semiconductor technologies, as a result of which they have attracted a great deal of interest. Their small sizes have made it possible to use them as solutions to overcome design limitations for devices that are in the size range of several nanometers.

Currently, a silicon nanowire based field effect transistor (FET) having a vertical structure to improve the density of integration and speed performance of semiconductors has been developed. In addition to FETs, the silicon nanowire can be used in a variety of applications including, for example, different electronic devices or sensors, photodetectors, silicon optoelectronic integrated circuits, and so forth.

SUMMARY

Disclosed herein is a branched nanowire having a broad surface area.

Disclosed herein too is a method for easily fabricating a branched nanowire.

Disclosed herein too is an electronic device with excellent photosensitive and conductive properties, which includes the branched nanowire fabricated as described above.

Disclosed herein too is a branched nanowire including a nanowire; and a parasitic nanowire branch grown from a silicon core, which is formed in the nanowire or on a surface of the nanowire.

Disclosed herein too is a method for fabrication of a branched nanowire including growing a silicon-based nanowire; forming a silicon core on a surface of the silicon-based nanowire; and growing a parasitic nanowire from the silicon core.

Disclosed herein too is an electronic device including a branched nanowire fabricated as described above, the device being selected from the group consisting of a biosensor, a photodetector, a light emitting element, a light receiving element, an energy storage element, and a cell.

A branched nanowire may be fabricated in place of single-stem nanowires without branches, thereby maximizing the merits of a one-dimensional structure having a large surface area. A branched nanowire based on silicon rich oxide (SRO) nanowires may be favorably used in applications that desire high efficiency and/or have a large surface area such as sensors, cells, light emitting elements, light receiving elements, and the like.

BRIEF DESCRIPTION OF THE DRAWINGS

The above and other objects, features and other advantages of the disclosure will be more clearly understood from the following detailed description taken in conjunction with the accompanying drawings, in which.

DETAILED DESCRIPTION

Figure 1:
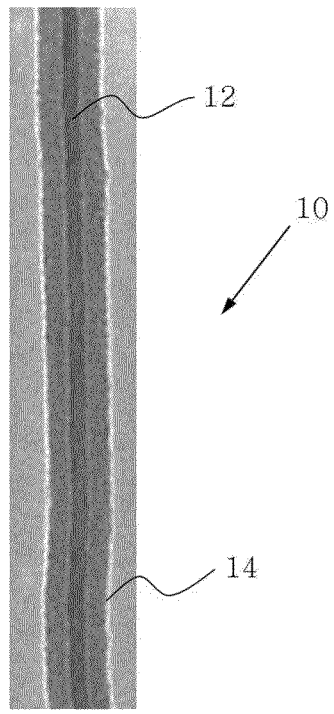
FIG. 1 is a transmission electron microscope (TEM) image showing a silicon-based nanowire containing a silicon rich oxide (SRO)

Hereinafter, exemplary embodiments of the disclosure will be described in greater detail with reference to the accompanying drawings.

Aspects, advantages, and features of the present invention and methods of accomplishing the same may be understood more readily by reference to the following detailed description of preferred embodiments and the accompanying drawings. The present invention may, however, may be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

Spatially relative terms, such as "below", "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings. However, the aspects, features, and advantages of the present invention are not restricted to the ones set forth herein. The above and other aspects, features and advantages of the present invention will become more apparent to one of ordinary skill in the art to which the present invention pertains by referencing a detailed description of the present invention given below.

A branched nanowire may include a plurality of parasitic nanowires grown on a surface of the branched nanowire.

FIG. 1 is a TEM image showing a silicon-based nanowire containing a silicon rich oxide ("SRO"), which is used to fabricate the branched nanowire. Referring to FIG. 1, the silicon-based nanowire 10 includes a core part 12 and a shell part 14. The core part 12 may comprise a crystalline or amorphous SRO while the shell part 14 may comprise silica. The silica in the shell part 14 may be prepared by oxidizing silicon during formation of the nanowire, or, alternatively under atmospheric oxygen.

The SRO may be represented in by the chemical formula $SiO_x$ (wherein x is 0<x<2), where the $SiO_x$ has an excess amount of silicon. If the nanowire contains SRO with a high Si content, the nanowire has excellent conductive properties and photosensitivity compared with common silicon-based nanowires. Therefore, limitations to the applications of comparative silica or silicon nanowires may be overcome by the use of the nanowires disclosed herein.

Figure 2:
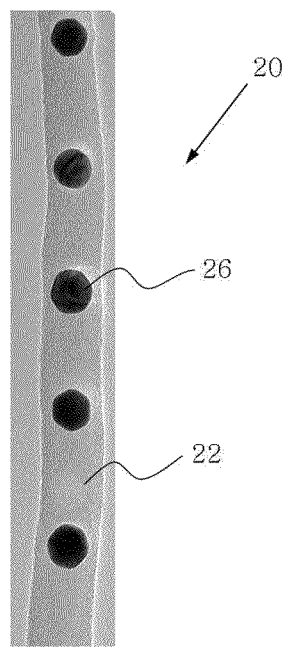
FIG. 2 is a TEM image showing a silicon-based nanowire containing metal nanodots.

FIG. 2 is a TEM image showing a silicon-based nanowire containing another SRO, which is used to fabricate the branched nanowire. Referring to FIG. 2, the silicon-based nanowire containing the SRO may have a structure wherein metal nanodots 26 are aligned in one direction within the core part of the silicon-based nanowire.

The silicon-based nanowire used in fabricating the branched nanowire, (in which the metal nanodot array is aligned in the core of the nanowire), may be easily used in the manufacture of an electronic device or other devices having optical characteristics. The core part 12 of the nanowire may serve to connect the metal nanodots 26 together. In other words, the metal nanodots contact the core part 12 of the nanowire.

The metal nanodots 26 aligned in one direction within the silicon-based nanowire may include metals usually used as a catalyst for growth of a nanowire and, more practically, may include at least one selected from a group consisting of gold (Au), nickel (Ni), iron (Fe), silver (Ag), aluminum (Al), palladium (Pd), and a combination comprising at least one of the foregoing metals. It is to be noted that the metal nanodots are generally aligned along an axis that is generally parallel to a surface of the nanowire.

Each of the metal nanodots aligned in one direction within the nanowire may have a diameter substantially equal to or less than the diameter of the formed nanowire. Additionally, the metal nanodots may be separated from each by a distance of about 10 nanometers ("nm") to about 1 micrometer ("μm").

The silicon-based nanowire 10 as shown in FIGS. 1 and 2 includes seeds from which a parasitic nanowire can be grown either in the nanowire or on a surface of the nanowire or in both the nanowire as well as on the surface of the nanowire. The seed can enable the parasitic nanowire to grow from the core of the silicon nanowire.

Since the parasitic nanowire grows from the silicon core through the surface of the nanowire, a branched nanowire structure may be formed.

The branched nanowire may be doped with N type or P type dopants. The doped nanowire may substantially exhibit excellent electrically conducting properties and photosensitivity compared with a comparative silicon nanowire, thus overcoming conventional limitations in the applications of silica or silicon nanowires.

As noted above, disclosed herein too is a method for fabrication of a branched nanowire with the structures described above.

The method for the fabrication of a branched nanowire includes growing a silicon-based nanowire; forming a silicon core in the silicon-based nanowire or on a surface of the silicon-based nanowire; and growing a parasitic nanowire from the silicon core.

The step of growing the silicon-based nanowire may be conducted by a process including coating a silicon substrate with a metal catalyst; placing the coated silicon substrate in a reaction furnace; heating the silicon substrate while introducing a nanowire precursor into the reaction furnace; and growing the silicon-based nanowire in a portion of the substrate that is coated with the metal catalyst.

In general, the process for growing a nanowire may be exemplified by a vapor-liquid-solid (VLS) process and/or a solid-liquid-solid (SLS) process.

The VLS process is a process for growing a silicon-based nanowire by coating a silicon substrate with a catalyst metal such as gold (Au), cobalt (Co), nickel (Ni), and the like; placing the coated substrate in a reaction furnace; introducing a silicon source in a gaseous state (such as, for example, $SiH_4$) into the reaction furnace; and subjecting vapor silicon containing seeds to be condensed and crystallized on a surface of the fused catalyst, resulting in the growth of a silicon-based nanowire.

On the other hand, the SLS process is a process for growing a silicon-based nanowire wherein silicon dispersed from a solid substrate (for example, a silicon substrate) is condensed and crystallized on a surface of a fused catalyst so as to be grown into the nanowire, while supplying no alternative vapor silicon thereto.

Various exemplary embodiments of the nanowire described in the disclosure are characterized in that either the SLS process or the VLS-like process is adopted to fabricate the nanowire.

The step of growing the silicon-based nanowire in the above method may also be conducted by another process that includes wet-etching a surface of a silicon substrate to generate a defect site; exposing the silicon substrate to deionized water or air to form an oxide layer on the surface of the silicon substrate; placing the silicon substrate having the oxide layer in a reaction furnace; heating the silicon substrate while introducing a nanowire precursor to the reaction furnace; and growing the silicon-based nanowire from the silicon core formed in the oxide layer.

Figure 3:
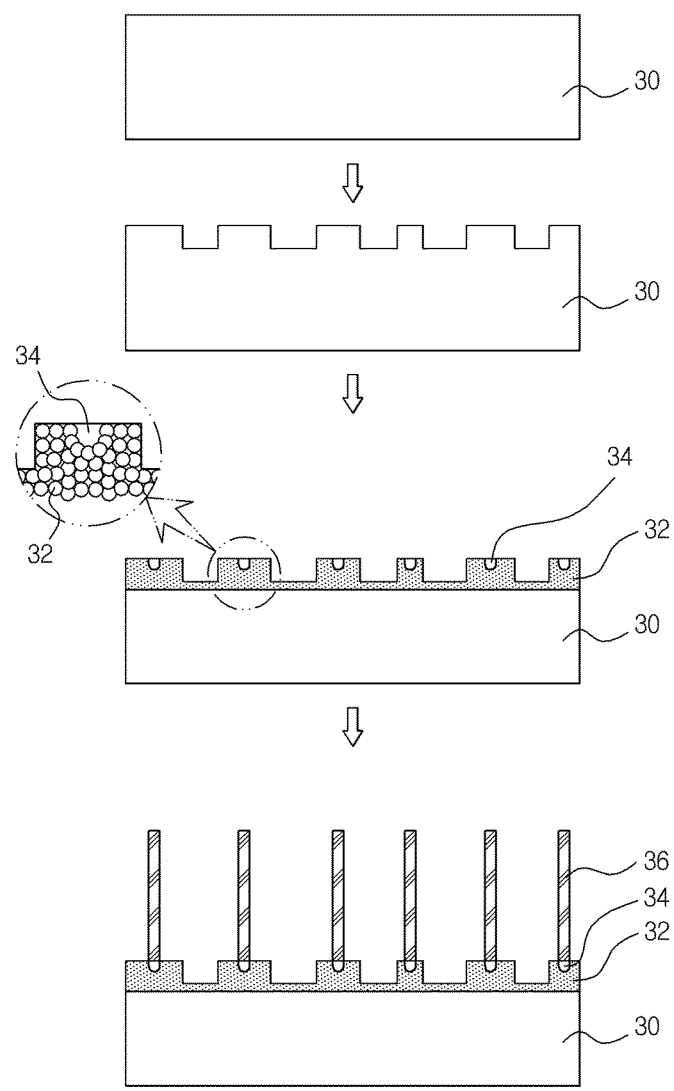
FIG. 3 is an exemplary flow diagram illustrating a method for fabrication of a silicon nanowire by a wet-etching process.

FIG. 3 is an exemplary process flow diagram illustrating a method for fabrication of a silicon nanowire by a wet-etching process without the use of a catalyst. Referring to the FIG. 3, a defect site is first formed by the wet-etching of a silicon substrate 30. Here, the substrate 30 may first be washed by conventional methods in order to remove impurities. This is generally conducted prior to the wet etching.

The wet-etching may then be conducted using an aqueous etching solution such as a sodium hydroxide (NaOH) solution, an acetic acid solution, a hydrofluoric acid solution, a phosphoric acid solution, and a combination comprising at least one of the foregoing solutions.

Next, the silicon substrate 30 is exposed to deionized (DI) water or to air so as to form an oxide layer 32 on a surface of the etched silicon substrate 30. The oxide layer 32 may include $SiO_x$ (wherein x is $0<x<2$), that is, the oxide layer 32 may consist of a silicon-rich $SiO_x$.

If the silicon substrate 30 is exposed to DI water or air for a long period of time, the substrate may be excessively oxidized, resulting in formation of $SiO_2$ instead of $SiO_x$ ($0<x<2$). Therefore, the exposure time may be an amount of about 10 minutes to about 1 hour and the oxide layer formed by the above process may have a thickness of not more than about 2 nanometers (nm).

Following this, the silicon substrate 32 having the oxide layer 32 is placed in a reaction furnace and heated. A nanowire precursor is simultaneously introduced into the furnace, so as to facilitate the growth of the silicon core 34 formed in the oxide layer 32 into a silicon nanowire 36.

In other words, due to the defect sites present on the surface of the silicon substrate, silicon atoms move towards a part of the substrate with a high surface energy so as to form a silicon rich portion in the oxide layer 32. The movement of the silicon atoms towards the etched portion of the substrate is to reduce the surface free energy. This silicon rich portion may function as the silicon core 34 from which the silicon nanowire is formed.

The nanowire precursor may be a silane. The nanowire precursor may be selected from a group consisting of silane ($SiH_4$), tetrachlorosilane ($SiCl_4$), dichlorosilane ($SiH_2Cl_2$), and a combination comprising at least one of the foregoing silanes.

The heating may be carried out at 400° C. to 700° C. and the heating time may be controlled depending on the desired length of the nanowire.

The branched nanowire can be formed using the silicon cores present in the silicon-based nanowire 10 or on the surface of the silicon-based nanowire 10. The branches may be formed by subjecting the silicon-based nanowire 10 to thermal energy irradiation or alternatively by subjecting the wire to electromagnetic radiation. In one embodiment, the silicon-based nanowire 10 may be subjected to thermal energy irradiation and electromagnetic radiation.

The density and/or the size of the silicon core may be varied depending upon an excess amount of silicon remaining in the silicon-based nanowire, amount of energy irradiated to the nanowire and/or the irradiation time thereof.

Figure 4:
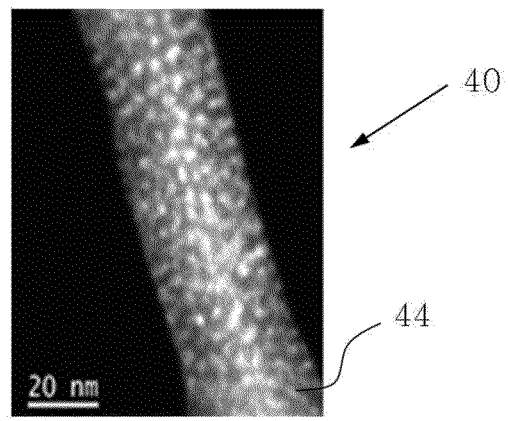
FIG. 4 is a TEM image showing silicon cores formed on the surface of a silicon-based nanowire.

FIG. 4 is a TEM image showing silicon cores exposed on the surface of the nanowire by thermal energy irradiation. More particularly, when a nanowire containing a SRO is heated to a temperature of not less than 1,000° C., or is otherwise subjected to ion beam, electron beam or laser irradiation, excess silicon may form silicon cores, which in turn, generate silicon quantum dots having an average size of several nanometers. Such silicon quantum dots exhibit unique optical characteristics that are not capable of being attained or of being displayed by bulk silicon, thereby emitting or receiving light in the visible light region.

The method for fabrication of the branched nanowire described above involves wet etching the silicon cores 44 present in the silicon-based nanowire 40 or wet etching the surface of the silicon-based nanowire 40 depicted in the FIG. 4.

Figure 5:
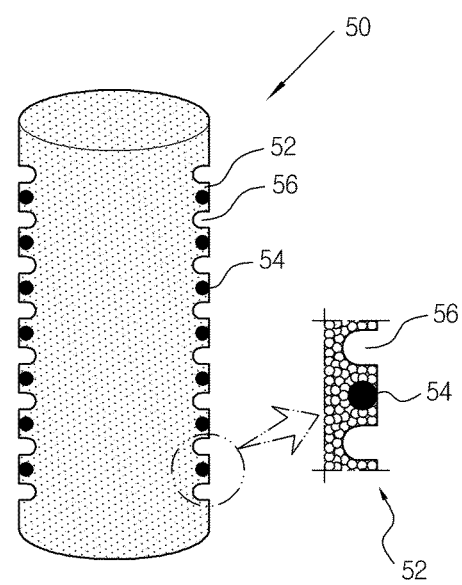
FIG. 5 is an exemplary schematic view illustrating silicon cores formed on a surface of a silicon-based nanowire by a wet-etching process.

FIG. 5 is an exemplary schematic view illustrating a silicon-based nanowire containing silicon cores formed by the wet-etching process. Referring to FIG. 5, wet-etching a surface of the silicon-based nanowire 50 facilitates the production of a defect site on the surface of the silicon-based nanowire 50. The silicon-based nanowire is washed prior to the etching to remove impurities.

An etching solution used in the wet-etching process may include a sodium hydroxide (NaOH) solution, an acetic acid solution, a hydrofluoric acid solution, a phosphoric acid solution, and a combination comprising at least one of the foregoing solutions.

The silicon-based nanowire 50 is then exposed to DI water or to air so as to form an oxide layer 52 on a surface of the silicon substrate 50. The oxide layer 52 may include $SiO_x$ (wherein x is 0<x<2). In other words, the oxide layer 52 may comprise a silicon rich $SiO_x$.

If the silicon substrate 50 is exposed to DI water or air for a long period of time, the substrate may be excessively oxidized, resulting in formation of $SiO_2$ instead of $SiO_x$ (wherein x is 0<x<2). Therefore, the exposure time may range from about 10 minutes to about 1 hour and the oxide layer formed by the above process may have a thickness of not more than about 2 nm.

In the aforementioned processes, the silicon cores 54 are formed on a surface of the silicon-based nanowire as depicted in the FIG. 5. In other words, due to the defect sites on the surface of the silicon-based nanowire, silicon atoms move towards the defect sites on the surface because they have a high surface energy. The movement of the silicon atoms to the defect sites reduces the surface free energy and in the process facilitates the formation of a silicon rich portion in the oxide layer 52. This silicon rich portion then functions as the silicon core 54.

Figure 6:
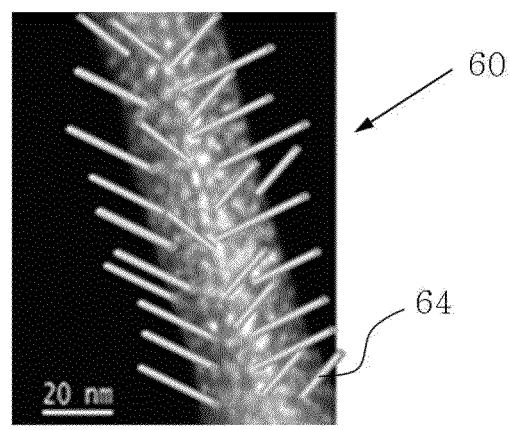
FIG. 6 is an image showing a branched nanowire including parasitic nanowires grown from the silicon cores.

FIG. 6 is another TEM image showing a structure 60 of a branched nanowire, where a number of parasitic nanowires 64 are grown from the silicon core present on the surface of the silicon-based nanowire.

With regards to the method for fabrication of the branched nanowire, growing the parasitic nanowire from the silicon core comprises placing the silicon-based nanowire having the exposed silicon core in a reaction furnace; heating the silicon-based nanowire while introducing a nanowire precursor to the reaction furnace; and growing the parasitic nanowire from the silicon core.

During the growth of the silicon-based nanowire or the parasitic nanowire, the nanowire precursor is placed in a reaction furnace. A gas selected from argon (Ar), nitrogen ($N_2$), helium (He) and hydrogen ($H_2$) is introduced into the reaction furnace. The amount of gas to be introduced may be an amount of about 0.001 standard liters per minute ("slm") to about 10 slm. The amount of gas may be altered depending on the production processes.

The reaction furnace for growing the nanowire may be a micro-chamber, into which oxygen may be introduced to reach an oxygen partial pressure of about $2\times10^{-1}$ torr to about $2\times10^{-6}$ torr. In this case, a minimum amount of oxygen remaining in the micro-chamber may play a valuable role in the growth of the nanowire containing the SRO. In other words, when fresh oxygen is introduced into the micro-chamber to reach an oxygen partial pressure of about $2\times10^{-1}$ torr to about $2\times10^{-6}$ torr, the nanowire containing the SRO in the form of $SiO_x$ (wherein x is 0<x<2) is formed. When the oxygen partial pressure exceeds about $2\times10^{-1}$ torr, $SiO_2$ nanowires are formed. On the other hand, if the oxygen partial pressure is less than about $2\times10^{-6}$ torr, Si nanowires may be formed.

Heating the substrate while introducing a gas to the reaction furnace or the micro-chamber may be conducted at about 400° C. to about 1,300° C., preferably at about 800° C. to about 1,200° C. under a pressure of about 10 torr to about 760 torr. The heating time may range from several minutes to several hours. These conditions including the pressure, the heating temperature and/or the heating time may be varied depending on the production processes.

Figure 7:
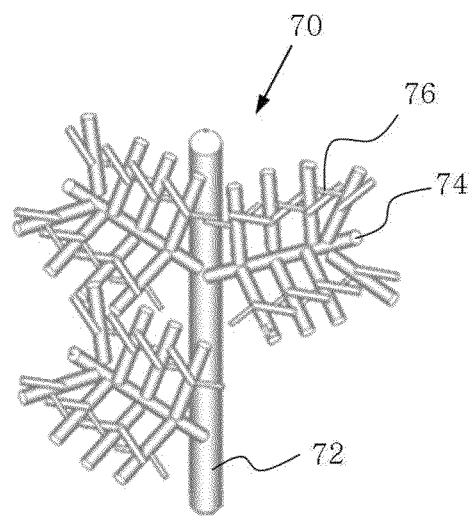
FIG. 7 is an exemplary schematic view illustrating a branched nanowire grown in a fractal form.

FIG. 7 illustrates an exemplary schematic of a branched nanowire grown in a fractal form according to an exemplary embodiment of the disclosure. Fractals are objects that display self-similarity at different magnifications. Fractals generally can be surface fractals or mass fractals. The fractal displayed in the FIG. 7 is a surface fractal that has an exponent that varies from about 1 to about 3.

In order to grow the parasitic silicon branches, the treated specimen is placed into a hot chamber at 300° C. to 1,200° C. and a gas such as $SiH_4$, $SiCl_4$, $H_2$, Ar, and the like is introduced to the chamber.

In one embodiment, a mechanism for growing the silicon-based nanowire uses the VLS process that is described above. The VLS process causes silicon atoms that are produced by the decomposition from a silane based gas (e.g., $SiH_4$ gas) to penetrate into the silicon cores formed on the surface of the silicon-based nanowire. These, in turn, are adsorbed onto the cores, so as to grow the silicon cores. The grown cores extend out of the silicon-based nanowire and grow into silicon parasitic nanowires 74 (as depicted in the FIG. 7) in the form of branches.

When a minimal amount of oxygen is introduced under the above conditions for growth of the parasitic nanowires 74, the grown parasitic nanowires 74 become SRO nanowires, which in turn, form another set (that is, third) of parasitic nanowires. During the formation of the third set parasitic nanowires, silicon cores may be formed on the surface of the earlier formed parasitic nanowires through wet-etching, so that the third set of parasitic nanowires may be grown from the silicon cores. As such, the aforementioned processes may be repeatedly conducted to fabricate a branched nanowire with a fractal structure where a branch extends out of another branch.

Figure 8:
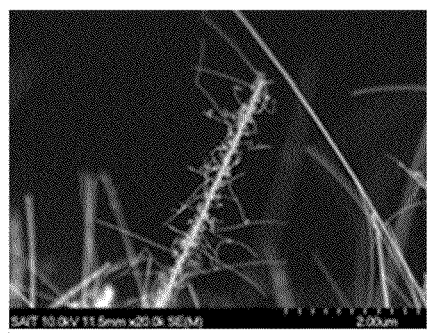
FIG. 8 is a TEM image showing a branched nanowire fabricated.

FIG. 8 is a TEM image showing a branched nanowire fabricated according to an exemplary embodiment of the disclosure. From FIG. 8, it can be seen that a fine nanowire having a tree-like appearance was grown.

Production of branched Nanowires

A natural oxide film is removed from a silicon substrate using an organic cleaning solvent or hydrofluoric acid as a cleanser. Gold (Au) nanoparticles (Nipponpaint Co., Ltd.) (used as catalyst particles) are spin-coated onto the cleaned substrate to a thickness of about 20 nm. Subsequently, the coated substrate is placed in a reaction furnace, and the surface of the substrate onto which the nanowires would be grown is directed downward. (Ar) is fed into the furnace at a flow rate of about 100 sccm while the partial pressure of ($O_2$) is $10^{-3}$ to $10^{-4}$ torr. The substrate is maintained at a pressure of about 500 torr and heated upto about 1000° C. for 30 minutes to grow the nanowires and metal nanodots. The resulting structure is slowly allowed to cool to about 25° C. under ambient conditions to complete the growth of the nanowires. The nanowires are subjected to electron beam (current density: 1 to 200 A/cm$^2$, 10 sec) to form silicon cores. $SiH_4$ diluted in $H_2$ (4 to 10% concentration) is fed into the furnace at a flow rate of about 20 to 100 sccm while the internal pressure is 4~500 torr and the temperature is 400 to 800° C. to complete the growth of the branched nanowires.

The disclosed embodiments have been described in detail with reference to the foregoing exemplary embodiments. However, these exemplary embodiments are proposed for illustrative purposes only and those skilled in the art will appreciate that various modifications and variations are possible, without departing from the scope and spirit of the disclosure. Accordingly, the scope of subject matters to be protected is duly defined only by the appended claims.

What is claimed is:

1. A branched nanowire comprising:
   a nanowire; the nanowire comprising an oxide layer on its surface, said surface including a plurality of defect sites and a silicon-rich oxide core having formula SiOx, wherein 0<x<2; and
   a first parasitic nanowire branch grown from the silicon-rich oxide core.

2. The branched nanowire according to claim 1, wherein the nanowire comprises the core part and a shell part, and the core part comprises a crystalline and/or an amorphous silicon rich oxide, while the shell part comprises silica.

3. The branched nanowire according to claim 1, wherein the nanowire comprises metal nanodots that are aligned in one direction within the nanowire.

4. The branched nanowire according to claim 2, where the nanowire comprises a silicon core disposed in the nanowire or on the surface of the nanowire.

5. The branched nanowire according to claim 1, wherein the nanowire comprises an oxide layer and at least one silicon core.

6. The branched nanowire according to claim 1, wherein a second parasitic nanowire grows on a surface of the first parasitic nanowire.

7. The branched nanowire according to claim 1, wherein the branched nanowire is doped with an N type dopant or a P type dopant.

8. An electronic device that comprises the branched nanowire as defined in claim 1.

9. The electronic device according to claim 8, wherein the electronic device is selected from the group consisting of a biosensor, a photodetector, a light emitting element, a light receiving element, an energy storage element and a cell.

* * * * *